US009866185B2

(12) United States Patent
Takemoto et al.

(10) Patent No.: US 9,866,185 B2
(45) Date of Patent: Jan. 9, 2018

(54) OPTICAL TRANSMISSION CIRCUIT WITH UPPER AND LOWER THRESHOLD CONTROL

(71) Applicant: Hitachi, Ltd., Chiyoda-ku, Tokyo (JP)

(72) Inventors: Takashi Takemoto, Tokyo (JP); Hiroki Yamashita, Tokyo (JP)

(73) Assignee: HITACHI, LTD., Tokyo (JP)

( * ) Notice: Subject to any disclaimer, the term of this patent is extended or adjusted under 35 U.S.C. 154(b) by 382 days.

(21) Appl. No.: 14/599,479

(22) Filed: Jan. 17, 2015

(65) Prior Publication Data

US 2015/0222236 A1    Aug. 6, 2015

(30) Foreign Application Priority Data

Jan. 31, 2014 (JP) ................. 2014-016350

(51) Int. Cl.
*H03F 3/08*     (2006.01)
*H03F 3/10*     (2006.01)
*H01S 5/042*    (2006.01)
*H04L 25/493*   (2006.01)
*H01S 5/024*    (2006.01)
*H01S 5/022*    (2006.01)

(52) U.S. Cl.
CPC ............. *H03F 3/08* (2013.01); *H01S 5/0427* (2013.01); *H03F 3/10* (2013.01); *H04L 25/493* (2013.01); *H01S 5/02272* (2013.01); *H01S 5/02415* (2013.01); *H01S 5/02469* (2013.01)

(58) Field of Classification Search
CPC .... H04B 10/695; H04B 10/69; H04B 10/693; H04B 1/1027; H04L 25/062
See application file for complete search history.

(56) References Cited

U.S. PATENT DOCUMENTS

2003/0043935 A1* 3/2003 Noh ................. H04L 25/062
                                              375/316
2012/0045217 A1   2/2012 Tsunoda

FOREIGN PATENT DOCUMENTS

JP            2012-043933 A      3/2012

* cited by examiner

*Primary Examiner* — Thanh Luu
(74) *Attorney, Agent, or Firm* — Miles & Stockbridge P.C.

(57) ABSTRACT

The high-speed and high-quality reception operation of a transimpedance amplifier of an optical communication module and a router including the same can be achieved. A preamplifier performs current/voltage conversion with respect to intersymbol interference due to bandwidth shortage of a laser diode. A threshold control circuit which generates positive and negative threshold voltages with respect to a center potential of an output signal, latch circuits, and a selector circuit are provided to the output of the preamplifier. An NRZ signal is received as a duobinary signal based on the sign determination result of the previous bit. The determination error rate of the latch circuits can thus be improved.

10 Claims, 12 Drawing Sheets

OPTICAL TRANSMISSION CIRCUIT WITH UPPER AND LOWER THRESHOLD CONTROL

CROSS-REFERENCE TO RELATED APPLICATION

This application claims the priority of Japanese Patent Application No. 2014-016350 filed Jan. 31, 2014, which is incorporated herein by reference in its entirety.

BACKGROUND

The present invention relates to an optical transmission circuit, an optical communication module, and an optical communication apparatus including the same. More specifically, the present invention relates to a technique effective to be applied to an optical communication apparatus such as a router and a server, and an optical communication module which is one of the components thereof and performs optical communication by using a laser diode and a photodiode.

For instance, Japanese Unexamined Patent Application Publication No. 2012-43933 describes, as a high-speed optical transmission circuit, a laser diode driver which is provided with an asymmetric pre-emphasis circuit for improving the operation bandwidth of a laser diode. Specifically, the pre-emphasis circuit including a delay circuit and a duty adjusting circuit is shown. This can drive the laser diode at high speed, and compensate for optical signal transmission characteristic deterioration (rise/fall time asymmetry).

SUMMARY

In recent years, a communication speed has been increased from 10 Gbps to 25 Gbps, 50 Gbps, and so on. With such increased communication speed, application of optical communication apparatuses, such as routers and servers, corresponding to optical fiber cables is being advanced. The optical communication apparatuses typically assume long-distance transmission in kilometers order therebetween. It is thus important to ensure high speed and reliability with the transmission distance.

Many of such optical communication apparatuses have a relatively large size (e.g., in several tens of centimeters or meters order). The apparatuses typically perform electric signal communication therein. That is, for instance, each optical communication apparatus converts an optical signal inputted from outside to an electric signal, uses the electric signal to perform short-distance communication (e.g., in meters order) therein for performing predetermined processing, and converts the electric signal to the optical signal which is then outputted to outside. Short-distance communication uses a copper wire cable, which significantly lowers transmission waveform quality with increased communication speed. Short-distance communication is thus required to apply optical communication. In this case, optical communication performs all signal processing in a router by using an electric signal which is required to be converted to an optical signal by an optical device. As compared with optical communication, electric communication includes components which are relatively inexpensive and have high reliability. Therefore, in shift from copper wire cables to optical fiber cables, important are optical transmission waveform quality enhancement and cost reduction and reliability improvement of the photoelectric conversion section.

However, with increased communication speed, intersymbol interference caused by bandwidth shortage of a laser diode LD deteriorates an optical transmission waveform. The communication speed is thus difficult to exceed, e.g., 40 Gbps. Intersymbol interference in the optical transmission waveform can be eliminated by improving the operation bandwidth of the laser diode LD. However, the most advanced optical device as such has a higher failure rate than the already distributed one-generation old optical device, resulting in increasing the cost. Consequently, short-distance communication cannot be shifted from electric communication to optical communication. Instead of using the laser diode LD which can be operated at higher speed, waveform equalization by an electric circuit can be used to compensate for bandwidth shortage of the laser diode LD. This is effective for cost reduction and reliability improvement of the photoelectric conversion section.

In addition, as a cause for optical transmission waveform deterioration, due to the influence of the relaxation oscillation frequency of the laser diode LD, the output of the laser diode LD which is modulated by an electric signal with rise/fall time symmetry forms a waveform with (rise/fall time asymmetry). FIG. 11 is an explanatory view showing an example of the temperature characteristic of the relaxation oscillation frequency of the laser diode LD. Relaxation oscillation is a phenomenon in which an optical output oscillates when a pulse-like electric current is injected into a semiconductor laser. The frequency at that time is the relaxation oscillation frequency. The value of the relaxation oscillation frequency is determined according to the device structure of the laser diode LD. At this frequency or more, the response characteristic lowers abruptly. An upper-limit frequency capable of operating the laser diode LD is thus determined based on the relaxation oscillation frequency. As the amount of the electric current supplied to the laser diode LD is larger, the value of the relaxation oscillation frequency increases. The transmission characteristic thus deteriorates more significantly at fall time than at rise time.

Further, the characteristic of the laser diode LD sensitively changes with respect to temperature change. As shown in FIG. 11, the relaxation oscillation frequency deteriorates more during the high-temperature operation than during the low-temperature operation. This results in deterioration of transmission quality with respect to temperature change.

To use an electric circuit to compensate for bandwidth shortage of the laser diode LD and rise/fall time asymmetry caused according to the relaxation oscillation frequency, Japanese Unexamined Patent Application Publication No. 2012-43933 describes a laser diode driver LDD. The laser diode driver LDD previously makes the enhancing amount at fall time larger than the enhancing amount at rise time (asymmetric pre-emphasis), and then outputs an optical signal which is equal at rise time and fall time.

As shown in FIG. 10A, specifically, the laser diode driver LDD includes a delay circuit DEL, a duty adjusting circuit DUTYAdj, prebuffers PrBuf, an addition and subtraction circuit ADD, and an output circuit DRV. The input voltage signal of the laser diode driver LDD is branched into a prebuffer PrBufm and the delay circuit DEL. The voltage signal branched into the delay circuit DEL is outputted with a constant delay difference with respect to the voltage signal branched into the prebuffer PrBufm. Further, the duty adjusting circuit DUTYAdj adjusts the duty ratio of the voltage signal with the delay difference so that the period of the "H" level becomes longer. The addition and subtraction circuit ADD performs subtraction between the voltage signal with the delay difference and the voltage signal without the delay difference. The resultant voltage signal thus has a larger enhancing amount at fall time than at rise time. The output circuit DRV converts the voltage signal with enhancing amount asymmetry at rise time and fall time to a current signal. The current signal with the asymmetric pre-emphasis characteristic drives the laser diode LD. This can improve high-speed driving and transmission quality. An optical signal which is equal at rise time and fall time can thus be outputted.

However, in the above conventional technique, the following problems arise.

FIG. 10B is an explanatory view showing the frequency characteristic of the conventional technique. Due to the influence of the relaxation oscillation frequency, the frequency characteristic of the laser diode LD has sharp roll-off. The inverse characteristic abruptly increases above the upper-limit frequency capable of operating the laser diode LD (−3 dB frequency).

In the frequency characteristic of pre-emphasis, according to the delay amount of the delay circuit DEL and the gain of a prebuffer PrBufe, a peak gain position (peak frequency) and a peak gain are determined. The frequency characteristic increases gently toward the peak gain. When pre-emphasis compensates for operation bandwidth shortage of the laser diode LD, the basic frequency of the targeted communication speed can be equalized. However, an in-band deviation occurs in the intermediate frequency bandwidth. This results in jitter increase to deteriorate transmission quality.

To solve this problem, the delay amount of the delay circuit DEL can be reduced to increase the peak frequency. However, at the same time, the peak gain at the basic frequency to be compensated lowers. To obtain the targeted equalization amount, it is necessary to increase the amount of pre-emphasis. This results in abrupt increase in power consumption.

Alternatively, pre-emphasis can be of a higher order by increasing the number of taps so that the frequency characteristic thereof is sharper. However, an increase of the number of taps makes the circuit scale larger. This results in parasitic capacitance increase, causing high-speed operation to be difficult. The power consumption also increases.

Further, the relaxation oscillation frequency characteristic of the laser diode LD sensitively changes with respect to temperature change. The conventional technique cannot compensate for rise/fall time asymmetry with respect to temperature change.

To solve this problem, a cooling unit such as a Peltier element can be provided to make the temperature of the laser diode LD constant. Alternatively, a monitor PD which monitors temperature change of the laser diode LD can be provided to adjust the delay amount of the delay circuit DEL and the adjusting amount of the duty adjusting circuit DUTYAdj with high accuracy according to the temperature change. However, the number of components increases, which cannot reduce the cost and size of the photoelectric conversion section.

The present invention has been made in view of such circumstances, and an object of the present invention is to provide an optical transmission/reception circuit and an optical communication system which can achieve increased communication speed at low cost and with high reliability. The above and other objects and novel features of the present invention will be apparent from the description of this specification and the accompanying drawings.

The following is a brief description of the gist of a representative embodiment of the present invention disclosed in this application.

In an optical transmission/reception circuit according to this embodiment, the −3 dB frequency of a laser diode LD is equal to or less than the basic frequency of a communication speed (e.g., at 50 Gbps, 25 GHz), a transimpedance amplifier TIA has a preamplifier which converts a single-phase current signal from a photodiode PD to a voltage signal, a threshold control circuit ATC which detects a center level (threshold voltage) from the output signal of the preamplifier and generates, with respect to the threshold voltage, threshold voltages (upper and lower threshold voltages) on plus and minus sides corresponding to a duobinary signal, latch circuits which convert the output signal of the preamplifier to digital values based on the upper and lower threshold voltages, and a selector circuit which selects one of the output paths of the upper and lower threshold voltages of the latch circuits based on the sign determination result of the previous bit.

Further, the optical transmission/reception circuit has a phase rotation circuit which determines the timings of the clocks of the latch circuits, and an optical characteristic compensation circuit which detects the errors of received data and automatically adjusts the voltage levels of the upper and lower threshold voltages of the threshold control circuit and the phases of the phase rotation circuit so that the errors are minimum.

This configuration can compensate for bandwidth deterioration and rise/fall time asymmetry specific to the characteristic of the laser diode LD and transmission quality deterioration caused by temperature change of the laser diode LD. With the use of the one-generation old laser diode LD with operation bandwidth shortage with respect to the communication speed, high-speed communication at low cost and with high reliability is enabled.

The effects obtained by the representative embodiment in the present invention disclosed will be briefly described. In the optical communication module, the reception section can improve bandwidth deterioration, temperature change, and rise/fall time asymmetry specific to the characteristic of the laser diode LD. High-speed, low-power consumption, and high-quality optical transmission can thus be achieved. Further, the one-generation old laser diode LD with operation bandwidth deterioration enables high-speed operation. The optical communication module can thus improve reliability and reduce the cost.

BRIEF DESCRIPTION OF THE DRAWINGS

FIGS. 1A and 1B show a router and an optical communication module which performs communication between cards in the router according to a first embodiment of the present invention, in which FIG. 1A is a block diagram showing a schematic configuration in the router, and FIG. 1B is a block diagram showing an example of the schematic configuration of the optical communication module;

FIGS. 6A, 6B, and 6C show the schematic mounting structures of an optical device and a semiconductor chip including an analog front end block of the optical communication module of FIG. 1B, in which FIG. 6A is a cross-sectional view showing the conventional example thereof, FIG. 6B is a cross-sectional view showing the mounting structure of an embodiment of the present invention, and FIG. 6C is a block diagram showing the main circuit configuration example of the semiconductor chip including a laser diode driver of the transmission system of FIG. 1B;

FIGS. 7A, 7B, and 7C show the detailed configuration examples of the output section of the laser diode driver of FIGS. 6A, 6B, and 6C, in which FIG. 7A is a circuit diagram when a bias current is supplied at the distal end of a wiring, FIG. 7B is a circuit diagram when a bias current is supplied outside the semiconductor chip, and FIG. 7C is a circuit diagram when a bias current is supplied at the proximal end of a wiring;

FIGS. 8A and 8B show an optical characteristic compensation circuit according to an embodiment of the present invention in the laser diode driver of FIGS. 6A, 6B, and 6C, in which FIG. 8A is a circuit diagram showing the detailed configuration thereof, and FIG. 8B shows the frequency characteristic of the output section including the optical characteristic compensation circuit;

FIGS. 9A and 9B show the detailed configuration examples of a preamplifier of the transimpedance amplifier of FIG. 2A, in which FIG. 9A is a circuit diagram of a preamplifier using a negative feedback resistor, and FIG. 9B is a circuit diagram of a regulated cascode preamplifier which is an open loop preamplifier;

FIGS. 10A and 10B show the laser diode driver which is one of the components of the transmission system of FIG. 1B, in which FIG. 10A is a block diagram showing the conventional example thereof, and FIG. 10B shows the frequency characteristic thereof;

DETAILED DESCRIPTION

Figure 1A:
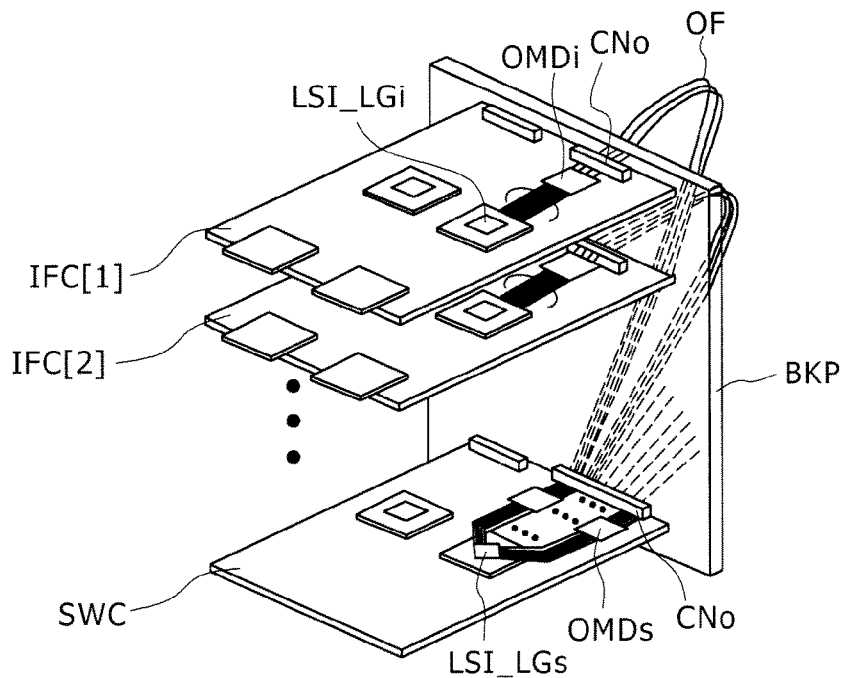

If considered necessary for the convenience thereof, the following embodiments will be divided into plural sections. Unless otherwise specified, they are not independent of each other, and one of them is associated with part or all of others by modification example, detail, and additional description. In addition, in the following embodiments, the number of elements (including the number, numerical value, amount, and range thereof) referred to herein is not limited to a specified number thereof and may be above or below the specified number, unless otherwise specified and except when it is, in principle, apparently limited to the specified number.

Further, needless to say, in the following embodiments, the components (including the element steps) thereof are not always essential, unless otherwise specified and except when they are considered to be, in principle, apparently essential. Likewise, in the following embodiments, the components thereof can have a shape and position relation substantially close or similar to those referred to herein, unless otherwise specified and except when they are considered to be, in principle, apparently different. This is the same for the numerical value and range.

The circuit elements configuring the function blocks of the embodiments are not particularly limited, but are formed over a semiconductor substrate of a single crystal silicon by the integrated circuit technique for a CMOS (complementary MOS transistor) and a bipolar transistor. In the embodiments, as an example of a MISFET (Metal Insulator Semiconductor Field Effect Transistor), a MOSFET (Metal Oxide Semiconductor Field Effect Transistor) (abbreviated as a MOS transistor) is used, which does not exclude any non-oxide film as a gate insulator film. In the drawings, the connection method of the substrate potential of the transistor, which is not particularly specified, is not particularly limited as long as it can operate the transistor normally.

Hereinafter, the embodiments of the present invention will be described in detail with reference to the drawings. In all the drawings for describing the embodiments, in principle, the same members are indicated by similar reference numerals, and the repeated description is omitted.

First Embodiment

Figure 1B:
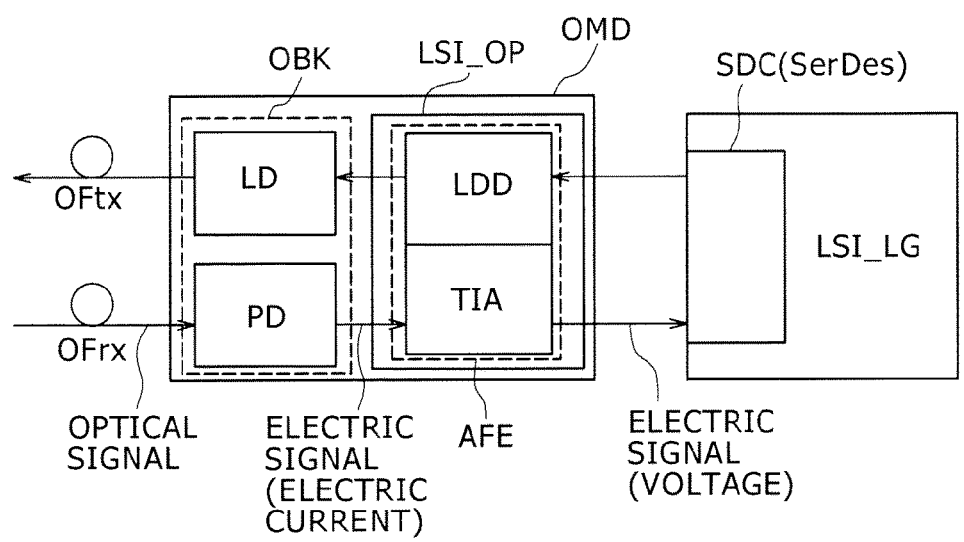

FIGS. 1A and 1B show a router and an optical communication module which performs communication between cards in the router according to a first embodiment of the present invention, in which FIG. 1A is a block diagram showing an example of a schematic configuration in the router.

The router is formed of a housing which has, for instance, a width and a depth of several tens of centimeters and a height of 1 to 2 m. On the surface of the housing, a large number of communication connectors are provided, each of which is e.g., an Ethernet cable terminal or an optical fiber cable terminal. As shown in FIG. 1A, the router has therein e.g., plural interface cards IFC[1], IFC[2], . . . , and a switch card SWC.

The cards are connected to card connectors on a component called a back plane BKP. Each card connector includes a connector for power supply from the back plane BKP to each card, and an optical connector (optical fiber connector) CNo for communication between the cards via an optical communication line (typically, an optical fiber cable) OF.

Here, the interface cards IFC are connected to the switch card SWC via the optical connectors CNo and the optical communication lines OF. Thereby, communication via the switch card SWC is enabled between communication connectors CNc for the interface cards IFC.

Over each interface card IFC, a logic device LSI_LGi and an optical communication module OMDi are mounted. The logic device LSI_LGi performs predetermined protocol processing necessary in the high hierarchy of communication. The optical communication module OMDi converts an electric signal as the input and output of the LSI_LGi to an optical signal, and performs input and output between it and the optical communication line OF via the optical connector CNo. Likewise, over the switch card SWC, mounted are a logic device LSI_LGs and an optical communication module OMDs are mounted. The logic device LSI_LGs performs predetermined protocol processing. The optical communication module OMDs converts an electric signal as the input and output of the LSI_LGs to an optical signal, and performs input and output between it and the optical communication line OF via the optical connector CNo.

In such an optical communication apparatus, the length of the optical communication line OF can reach e.g., several meters. In this case, the use of a copper wire cable instead of the optical communication line OF cannot cope with communication at the level of e.g. several tens of Gbps due to transmission loss. It is thus useful to use the optical communication module of this embodiment.

FIG. 1B is a block diagram showing an example of the schematic configuration of an optical communication module OMD in the router of FIG. 1A. The optical communication module OMD includes an analog front end block AFE, and an optical device block OBK. The optical device block OBK includes a laser diode LD which performs output to an optical communication line for transmission OFtx, and a photodiode PD which converts an optical signal inputted from an optical communication line for reception OFrx to an electric signal (a current signal).

Each of the laser diode LD and the photodiode PD includes e.g., a semiconductor chip. Actually, according to the number of communication channels, each of the laser diode LD and the photodiode PD includes plural semiconductor chips, or a semiconductor chip integrated in an array. The analog front end block AFE includes a laser diode driver LDD which drives the laser diode LD, and a transimpedance amplifier TIA which amplifies the current signal from the photodiode PD and converts it to a voltage signal.

Here, the analog front end block AFE is formed over one semiconductor chip LSI_OP. However, the laser diode driver LDD and the transimpedance amplifier TIA may be formed over individual chips.

The optical communication module OMD is electrically connected to a logic device LSI_LG outside thereof, and performs transmission and reception of electric and voltage signals between a transmission speed conversion circuit SDC called a SerDes (Serializer/Deserializer) mounted in the logic device LSI_LG and the analog front end block AFE (the laser diode driver LDD and the transimpedance amplifier TIA).

For instance, between the logic device LSI_LG and the optical communication module OMD of FIG. 1A, 25-Gbps×4-channel electric signals are transmitted and received. Communication between the cards (each interface card IFC and the switch card SWC) via each optical communication line OF is also performed by 25-Gbps×4-channel optical signals.

In the example of FIG. 1B, the semiconductor chip LSI_OP includes only the analog front end block AFE. However, to reduce the load of electric transmission by lowering the transmission speed of each channel between the optical communication module OMD and the logic device LSI_LG, in addition to the analog front end block AFE, the transmission speed conversion circuit SDC may be mounted in the optical communication module OMD. The analog front end block AFE and the transmission speed conversion circuit SDC may be mounted over different semiconductor chips. Alternatively, to reduce power consumption by electric I/O reduction between the analog front end block AFE and the transmission speed conversion circuit SDC, the analog front end block AFE and the transmission speed conversion circuit SDC may be formed by the same semiconductor process for CMOS and be then integrated over the semiconductor chip LSI_OP.

Figure 2A:
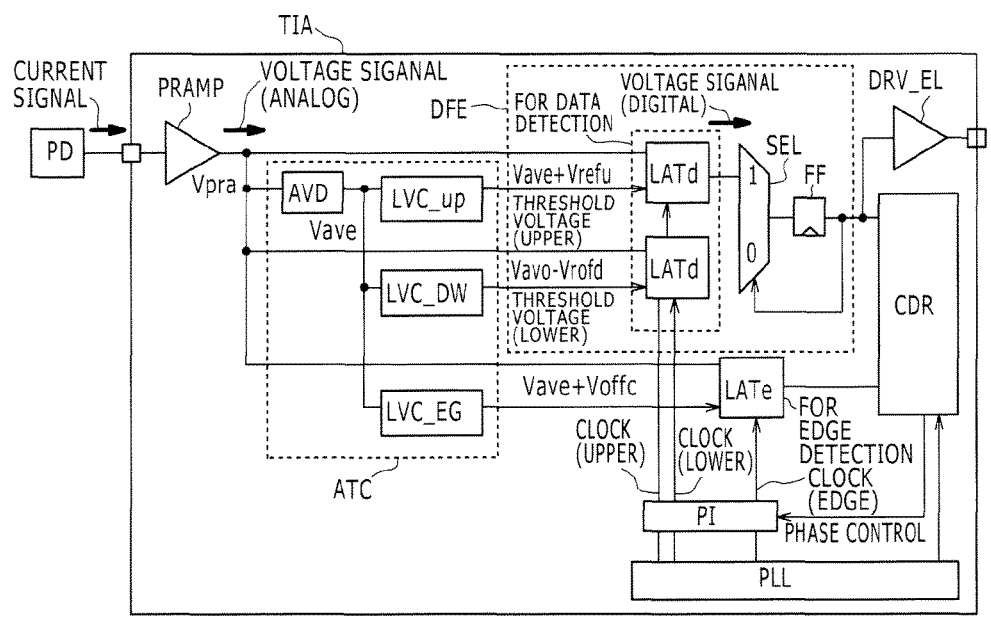
FIG. 2A is a block diagram showing a configuration example of a transimpedance amplifier which is one of the components of the reception system of FIG. 1B.

FIG. 2A shows a configuration example of the transimpedance amplifier TIA of the present invention which is one of the components of the reception system of FIG. 1B. This embodiment assumes that, on the transmission side, the laser diode LD whose operation bandwidth (−3 dB frequency) does not reach the basic frequency of a communication speed is used. Thus, without using the most advanced laser diode LD, high-speed communication exceeding the operation bandwidth of the laser diode LD is enabled. This enables cost reduction and reliability improvement of the optical communication module.

Figure 2B:
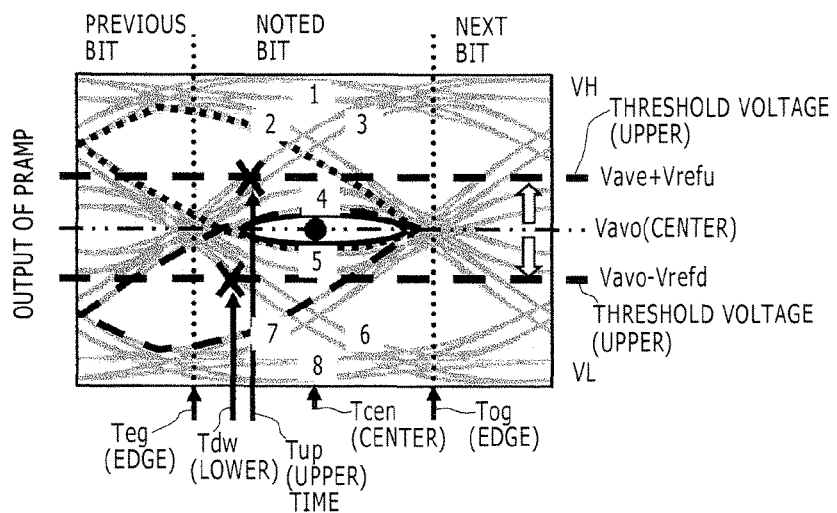
FIG. 2B is an explanatory view showing a reception eye waveform and the reception system of the present invention when a laser diode whose operation bandwidth does not reach the basic frequency of a communication speed is used for the transmission section.

FIG. 2A shows the block configuration of the transimpedance amplifier TIA which receives an optical input from the laser diode LD with bandwidth shortage. FIG. 2B is an explanatory view showing an output eye waveform of a preamplifier PRAMP and the reception system of the present invention.

First, the circuit of FIG. 2A will be described.

The transimpedance amplifier TIA according to this embodiment includes the preamplifier PRAMP which converts a single-phase current signal from the photodiode PD to a voltage signal, a threshold control circuit ATC which detects a center level (threshold voltage) Vave from the output signal of the preamplifier PRAMP and generates upper and lower threshold voltages Vave+Vrefu and Vave−Vrefd which are level-shifted to plus and minus sides with respect to the threshold voltage, a determination feedback equalizer DFE which includes latch circuits LATd for data detection which use the upper and lower threshold voltages as threshold voltages for logic determination and convert the output signal of the preamplifier PRAMP to digital values, a selector circuit SEL which selects one of the output paths of the upper and lower threshold voltages of the latch circuits LATd based on the determination result of the previous bit, and a flip flop circuit FF, a latch circuit LATe which converts the output signal of the preamplifier PRAMP to a digital value based on the selected output data and the threshold voltage at a data transition timing (edge), a clock data recovery circuit CDR which generates a phase control signal for adjusting clock timings from the output signal of the latch circuit LATe, a phase-locked loop PLL which generates clocks, a phase rotation circuit PI which adjusts the phases of the generated clocks based on the phase control signal supplied from the clock data recovery circuit CDR, and an electric driver DRV_EL which outputs the output signal of the determination feedback equalizer DFE to the outside of the semiconductor chip.

In addition, the threshold control circuit ATC includes a threshold detection circuit AVD, and level shift circuits LVC (LVC_UP, LVC_DW, LVC_EG). The threshold detection circuit AVD detects the threshold voltage Vave. The level shift circuits LVC (LVC_UP, LVC_DW, LVC_EG) generate the upper and lower threshold values, and adjust the voltage levels for compensating for the offset voltages of the latch circuits LAT.

Figure 11:
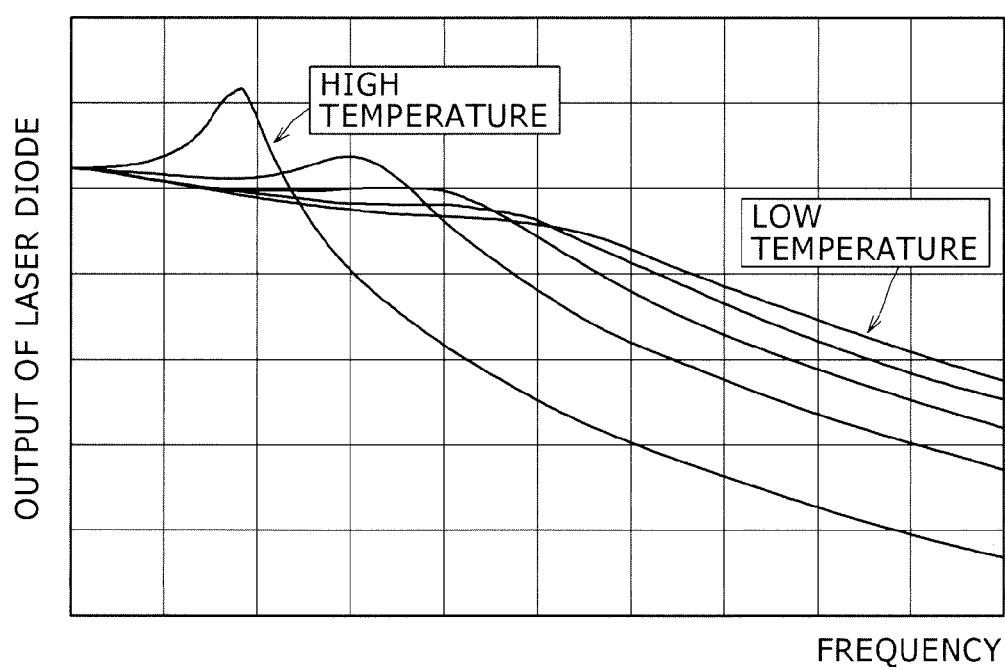
FIG. 11 is an explanatory view showing an example of the temperature characteristic of the relaxation oscillation frequency of the laser diode of the transmission system of FIG. 1B.

Here, as indicated by the relaxation oscillation frequency characteristic of FIG. 11, the laser diode LD used in the transmission section has a frequency characteristic in which roll-off is sharp. Above the bandwidth capable of operating the laser diode LD (−3 dB frequency), the gain deteriorates abruptly.

In this embodiment, the operation bandwidth of the laser diode LD is lower than the basic frequency of the communication speed. As shown in FIG. 2B, the output waveform of the preamplifier PRAMP has a very small eye amplitude with respect to ten patterns having the highest frequency component due to intersymbol interference. Like the conventional transmission system, a data determination point is provided on the center threshold value of the eye enclosed by the thick line of FIG. 2B (black mark, time Tcen, and threshold voltage Vave), and H/L is then determined according to whether the signal waveform passes above or below the threshold voltage Vave. This result shows a small eye amplitude. Due to the influence of circuit thermal noise and power supply noise, the possibility that the latch circuits LAT mistake determination is high.

To improve the determination error rate, an analog equalizer CTLE can be provided to the output of the preamplifier PRAMP to enhance the periphery of the basic frequency of the communication speed for increasing the eye amplitude. However, in the frequency characteristic of the laser diode LD, roll-off is sharp due to the influence of the relaxation oscillation frequency. An in-band deviation occurs even when the analog equalizer CTLE improves the operation bandwidth. This results in a jitter increase, which is incapable of determination error rate improvement. Accordingly, in this embodiment, data determination points are provided on an upper eye threshold value (x mark, time Tup, voltage level Vave+Vrefu) and a lower eye threshold value (x mark, time Tdw, voltage level Vave−Vrefd), not on the threshold voltage Vave. Then, one of the upper and lower determination points is adopted according to the determination result of the previous bit. The determination error rate of the latch circuits LAT can thus be improved.

That is, the eye waveform of the laser diode LD with bandwidth shortage takes eight different paths with respect to the noted bit and the previous and next bits. When the previous bit is H, the upper eye waveform (dotted line) is used. When the previous bit is L, the lower eye waveform (chain line) is used.

In this way, the reception section handles the NRZ (Non Return to Zero) signal as a duobinary signal. The determination error rate of the reception section can thus be improved even when the eye amplitude is very small due to bandwidth shortage of the laser diode LD. In addition, the phase rotation circuit PI and the level shift circuits LVC independently adjust the times Tup and Tdw and the voltage levels Vave+Vrefu and Vave−Vrefd of the upper and lower eye threshold values. Signal quality deterioration due to rise/fall time asymmetry which is the characteristic specific to the laser diode LD can also be improved.

In this embodiment, the level shift circuits LVC are used for adjusting the upper and lower threshold values. However, for instance, to the output of the threshold detection circuit AVD and to the output of a differential amplifier, an offset amplifier may be provided which adjusts the voltage level by using a constant current source. That is, any unit may be used as long as it can generate the upper and lower threshold values and the voltage levels corresponding to the offset voltage compensation of the latch circuits LAT. In the configuration example of FIG. 2A, one preamplifier PRAMP is provided. However, when the output amplitude of the preamplifier PRAMP is less than the minimum reception amplitude of the latch circuits LAT, a single end voltage amplifier may be added to the output of the preamplifier PRAMP. Alternatively, a differential voltage amplifier may be added before the latch circuits LAT.

As described above, the optical communication module and the router including the transimpedance amplifier of the first embodiment use the laser diode LD with bandwidth shortage with respect to the necessary communication bandwidth. The optical communication module at low cost and with high reliability can achieve high-speed and high-quality optical transmission/reception operation.

Second Embodiment

Figure 3:
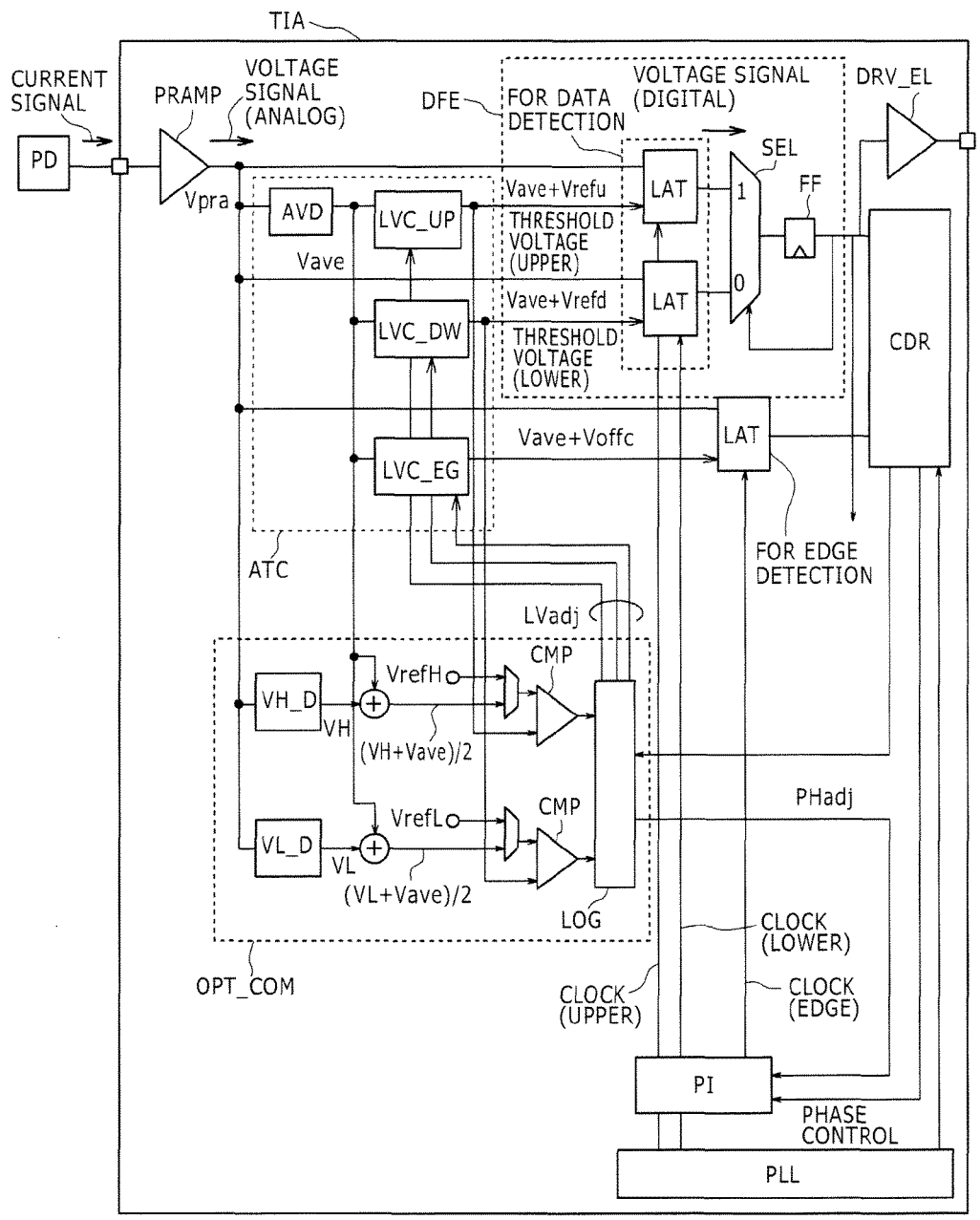
FIG. 3 is a block diagram showing another configuration example of the transimpedance amplifier which is one of the components of the reception system of FIG. 1B.

FIG. 3 shows a configuration example of the transimpedance amplifier TIA shown in FIG. 2A, which includes an optical characteristic compensation circuit OPT_COM which automatically adjusts the upper and lower threshold voltage levels and the timings (phases) of clocks according to change in environment such as temperature.

For the voltage levels of the upper and lower threshold values, the optical characteristic compensation circuit OPT_COM monitors the voltage levels of a data signal, and controls the voltage shift amounts of the level shift circuits LVC so that the voltage errors with the optimum voltage levels (the upper and lower threshold values) are minimum. For the phases of clocks, the optical characteristic compensation circuit OPT_COM monitors, from the output of the clock data recovery circuit CDR, the phase errors of clock edges with respect to the timings of optimum data edges, and controls the phases of the phase rotation circuit PI so that the phase errors are minimum. This enables the reception side to compensate for optical transmission waveform quality deterioration of the laser diode LD caused by temperature change in the transmission section.

For instance, in the configuration example of FIG. 3, the optical characteristic compensation circuit OPT_COM includes peak detection circuits (VH_D, VL_D) which detect H and L levels (VH, VL) from an output Vpra of the preamplifier PRAMP, adders which calculate upper and lower average levels ((Vave+VH)/2, (Vave+VL)/2) from the threshold voltage Vave and the H and L levels, selector circuits which select ones of the upper and lower average levels and upper and lower threshold reference voltages (VrefH, VrefL), error detection circuits CMP which compare the upper and lower threshold voltages with the outputs of the selector circuits, and a compensation logic circuit LOG which monitors the outputs of the error detection circuits CMP as comparators and the output of the clock data recovery circuit CDR, and outputs level shift amount adjusting signals LVadj and a phase adjusting signal PHadj which optimize the upper and lower threshold values and the clock phases.

The upper and lower threshold reference voltages (VrefH, VrefL) are used as upper and lower threshold reference voltages assumed to be optimum when due to the characteristic specific to the laser diode LD, the optimum values of the upper and lower threshold values are different from the upper and lower average levels ((Vave+VH)/2, (Vave+VL)/2). In the embodiment of the present invention, the error detection circuits CMP monitor the error voltages between the set upper and lower threshold values Vave+Vrefu and Vave−Vrefd and the upper and lower average levels or the upper and lower threshold reference voltages. Then, to minimize the error voltages, the optimizing algorithm of Sing−Sing LMS in the compensation logic circuit LOG automatically adjusts the level shift amounts Vrefu and Vrefd of the level shift circuits LVC to the optimum values. Signal quality deterioration with respect to change in environment such as temperature can thus be compensated. Likewise, for the timings of the clocks, the clock data recovery circuit CDR monitors the set timings (phases) of the clocks of the latch circuits LAT for data detection, and detects the phase errors with the assumed optimum clock phases. Then, to minimize the phase errors, the compensation logic circuit LOG adjusts the phases of the phase rotation circuit PI so that they have the optimum values. Here, the timings of the clocks of the upper and lower eye waveforms are set independently. Transmission quality deterioration due to rise/fall time asymmetry which is the characteristic specific to the laser diode LD can thus be compensated.

For the operation of the apparatus, when a training period using a specific data pattern can be provided, the optical characteristic compensation circuit OPT_COM may have an error detector which monitors the output of the clock data recovery circuit CDR, and adjust the level shift amounts of the upper and lower threshold values and the phases of the clocks so that errors are minimum with respect to the specific data pattern.

As described above, the optical communication module and the router including the transimpedance amplifier of the second embodiment can achieve high-speed and high-quality optical transmission/reception operation without compensating for the temperature of the laser diode LID on the transmission side.

Third Embodiment

Figure 4:
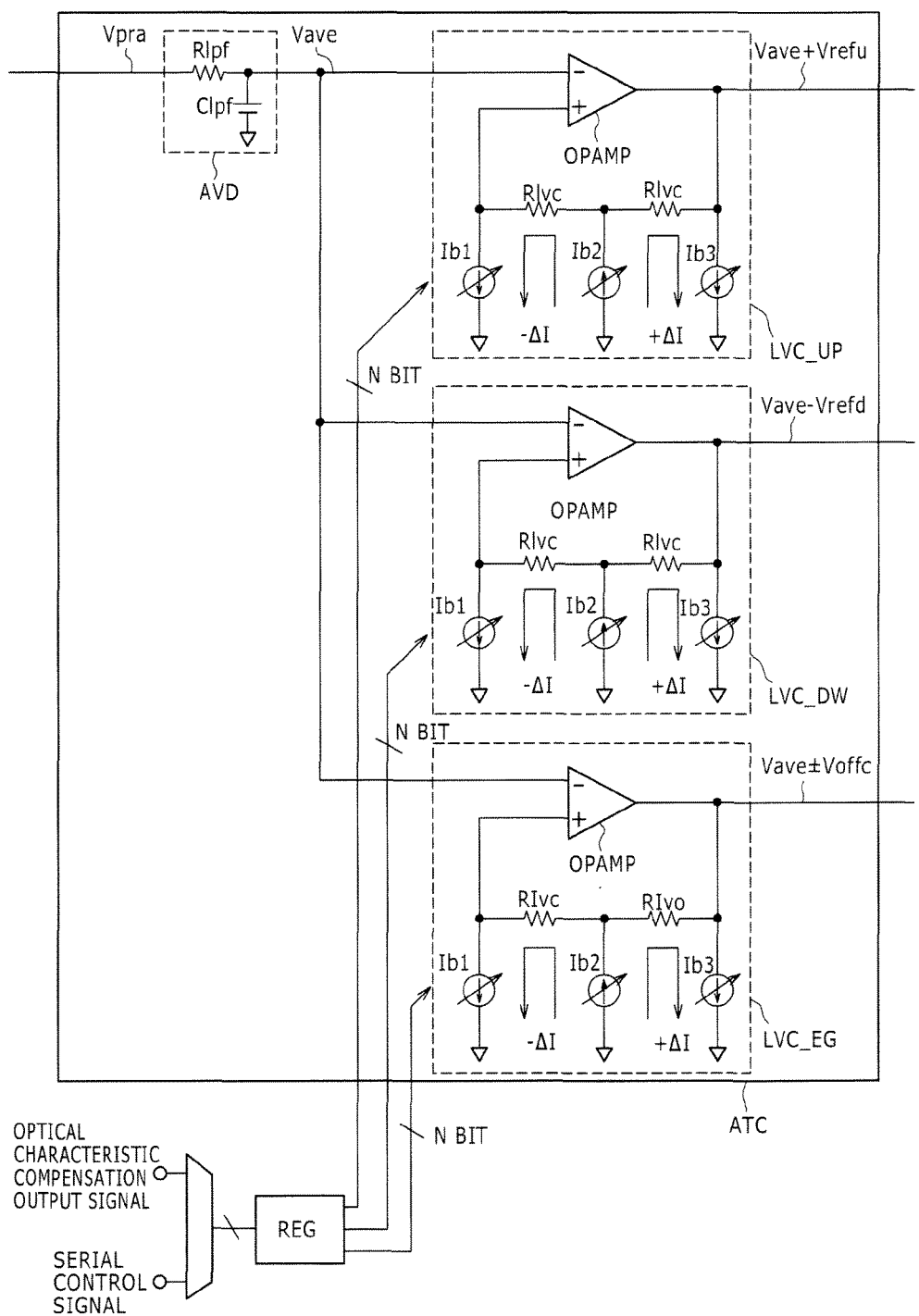
FIG. 4 is a block diagram showing a configuration example of a threshold control circuit of the transimpedance amplifier of FIG. 2A.

FIG. 4 shows a configuration example of the threshold control circuit ATC of the transimpedance amplifier TIA according to the first embodiment of the present invention.

The threshold control circuit ATC includes the threshold value detection circuit AVD which detects the threshold voltage Vave from the output of the preamplifier PRAMP, the level shift circuits LVC which generate the upper and lower threshold values and compensate for the offset voltages of the latch circuits LAT for data detection and edge detection, a memory or a register REG having a unit which holds level shift amounts, and a selector circuit which selects one of an external serial signal for writing the value of the register REG and the output signal from the optical characteristic compensation circuit OPT_COM of FIG. 3.

The threshold detection circuit AVD is a low-pass filter LPF including a resistor Rlpf and a capacitance Clpf. Here, the bandwidth of the low-pass filter LPF is required to have a sufficiently low bandwidth with respect to a long-period pattern received.

Each of the level shift circuits LVC for data detection and edge detection includes an operational amplifier OPAMP, two resistors Rlvc connected in series between the input and output terminals of the operational amplifier OPAMP, three constant current sources Ib1, Ib2, and Ib3 capable of setting optional electric currents. The configuration example shown in FIG. 4 is a negative feedback path in which the output terminal of the operational amplifier OPAMP is connected to the positive input terminal thereof via the resistors Rlvc, thereby forming a voltage follower. When the gains of the operational amplifiers OPAMP are sufficiently high, the current values $\pm\Delta I$ of the constant current sources Ib1, Ib2, and Ib3 are optionally set. The output voltages are then Vave$\pm$Rlpf$\times\Delta I$ with respect to the threshold voltage Vave. The upper and lower threshold voltages Vave+Vrefu and Vave−Vrefd can thus be generated.

Fourth Embodiment

Figure 5:
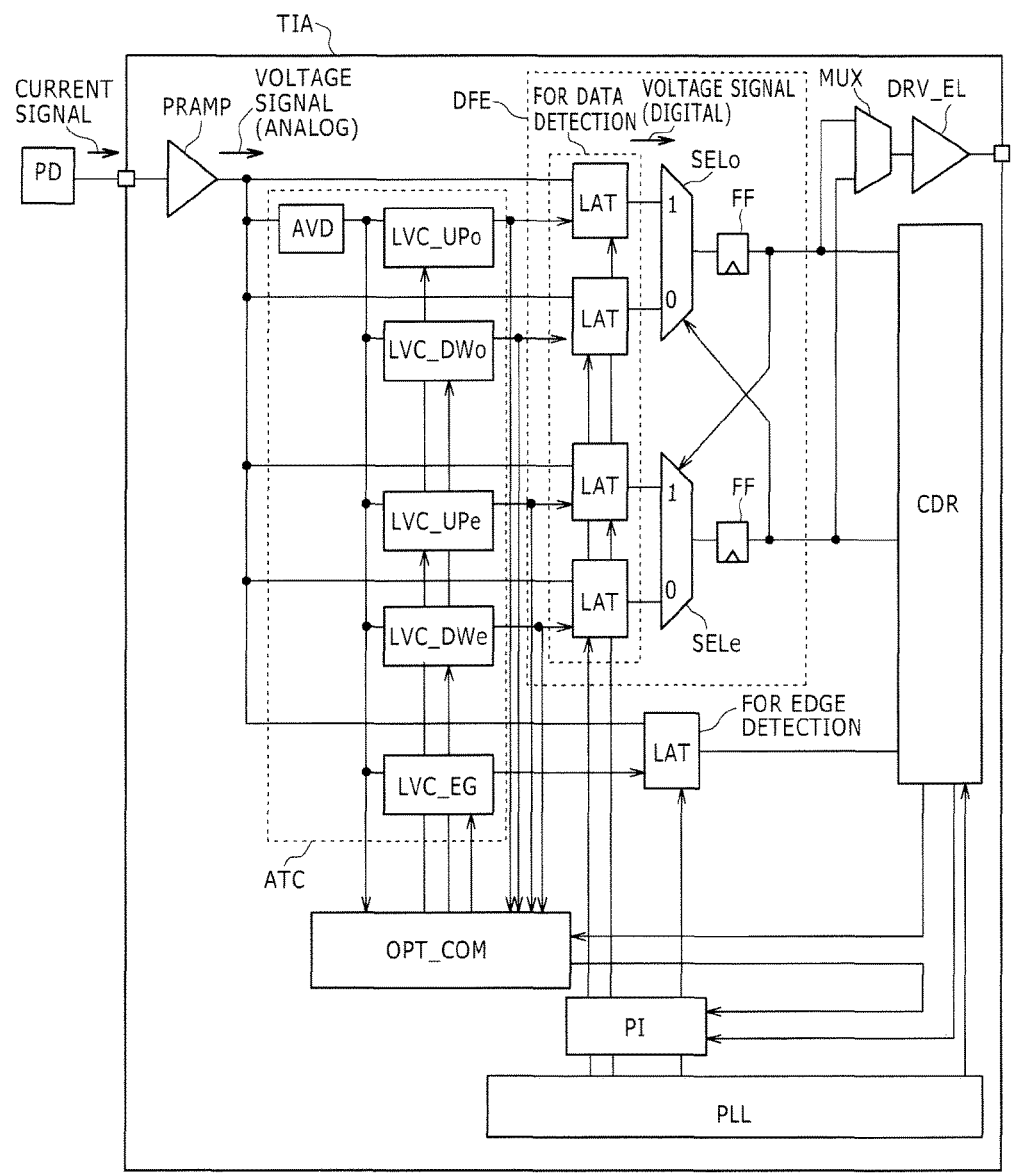
FIG. 5 is a block diagram showing a further configuration example of the transimpedance amplifier which is one of the components of the reception system of FIG. 1B.

FIG. 5 is a diagram showing a further embodiment of the determination feedback equalizer DFE of the transimpedance amplifier TIA of the optical communication module according to the first embodiment.

As compared with the configuration example of FIG. 3, in the transimpedance amplifier TIA shown in FIG. 5, the number of the latch circuits LAT is doubled so that data is divided into an odd bit and an even bit. The transimpedance amplifier TIA is thus operated at half rate in which the operation clock frequency thereof is half.

By this configuration, the operation speed of the circuits after the latch circuits LAT and the clock distribution circuits becomes half. Instead of a Current Mode Logic (CML) circuit such as a differential circuit with large power consumption, a CMOS circuit with small power consumption and at low operation speed is applicable. The power of the transimpedance amplifier TIA can thus be lowered.

In addition, in this configuration example, the transimpedance amplifier TIA is operated at half rate. However, the transimpedance amplifier TIA may be operated at quarter rate by further doubling the number of the latch circuits LAT. Further, in this configuration, a 2:1 MUX circuit returns the outputs of the determination feedback equalizer DFE to the original bit rate, and the electric driver DRV_EL then outputs the resultant outputs. However, the resultant outputs may be outputted at half rate according to the specification of the chip connected to the optical communication module. This circuit also uses the upper and lower threshold values for signal reception, and includes the optical characteristic compensation circuit OPT_COM. The same operation and effects as the first and second embodiments of the present invention can thus be obtained.

Fifth Embodiment

Figure 6A:
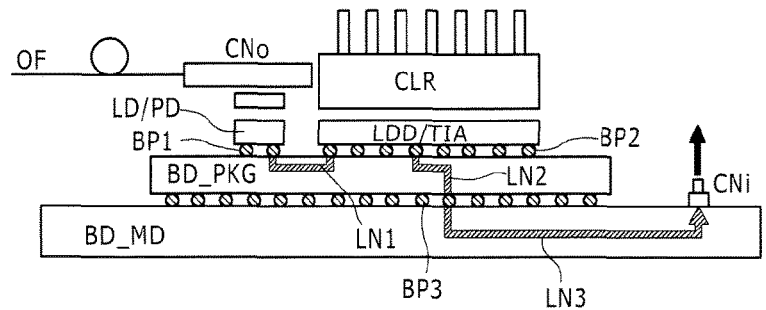

FIG. 6A is a cross-sectional view showing a schematic conventional mounting structure associated with the optical device LD/PD and the semiconductor chip LDD/TIA in the optical communication module OMD of FIG. 1B.

FIG. 6A shows an example in which the semiconductor chip LDD/TIA and the optical device LD/PD are mounted over one package wiring substrate BD_PKG.

The optical device LD/PD is connected to a first plane of the package wiring substrate BD_PKG via bumps BP1 formed thereon. The semiconductor chip LDD/TIA is connected to the first plane of the package wiring substrate BD_PKG via bumps BP2 formed thereon.

One BP1 and one BP2 are connected via a wiring (typically, a copper wiring) LN1 in the package wiring substrate BD_PKG. The optical device LD/PD is thus electrically connected to the semiconductor chip LDD/TIA. In addition, the package wiring substrate BD_PKG is connected to a first plane of a module wiring substrate BD_MD via bumps BP3 formed on a second plane thereof. Another BP2 is thus connected to one BP3 via a wiring LN2 in the package wiring substrate BD_PKG. On the first plane of the module wiring substrate BD_MD, a connector CNi is provided. The one BP3 is connected to the connector CNi via a wiring LN3 in the module wiring substrate BD_MD.

Thereby, the semiconductor chip LDD/TIA is electrically connected to the connector CNi via the wirings LN2 and LN3. The connector CNi performs the input/output of an electric signal with respect to the transmission speed conversion circuit SDC (SerDes) in the logic device LSI_LG. The optical device LD/PD performs the input/output of an optical signal with respect to the optical communication lines OFtx and OFrx via the optical connector CNo including a collimate lens and a converging lens.

In addition, a cooling unit CLR is provided over a second plane of the semiconductor chip LDD/TIA. The cooling unit CLR typically includes a heat sink and a water cooling device.

To achieve throughput increase by the optical communication module with multiple channels, it is necessary to prevent cross talk caused in the wiring LN1 between the optical device LD/PD and the semiconductor chip LDD/TIA. To prevent the cross talk, a so-called coplanar line in which a grounding wiring is provided between the wirings. This can reduce mutual capacitance and mutual inductance between the adjacent channels. The cross talk between the adjacent channels can thus be reduced.

In addition, to reduce the optical communication module in size, the pitch between the channels is required to be narrower (250 µm or less). The wiring impedance in the package wiring substrate BD_PKG is thus at most approximately 30Ω from the limit of the wiring width of the wiring LN1 even when impedance lowering is attempted.

When a DFB-LD (Distributed-Feedback Laser Diode) is adopted for the laser diode LD as a light source, with the impedance thereof being only approximately 10Ω, reflection due to impedance mismatching is caused between it and the package. This results in significant deterioration of signal quality.

Figure 9A:
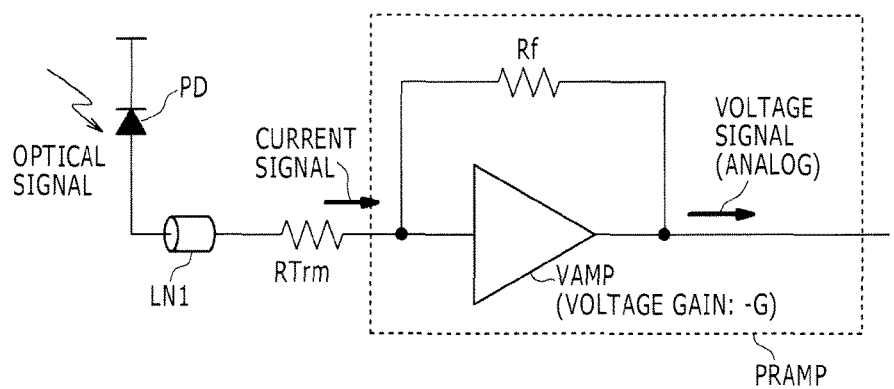
Figure 9B:
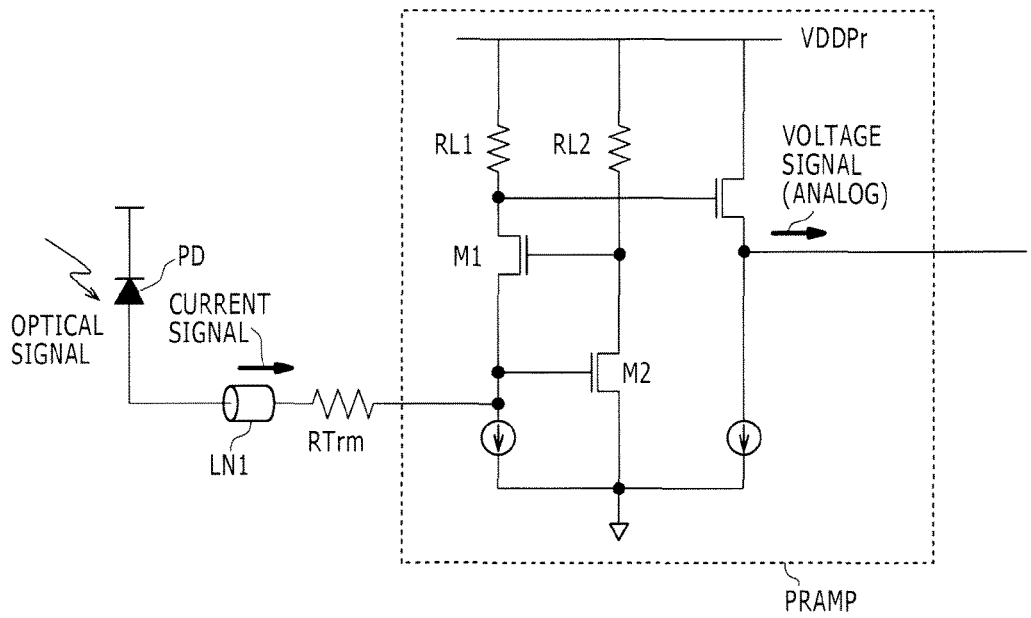
Figure 10A:
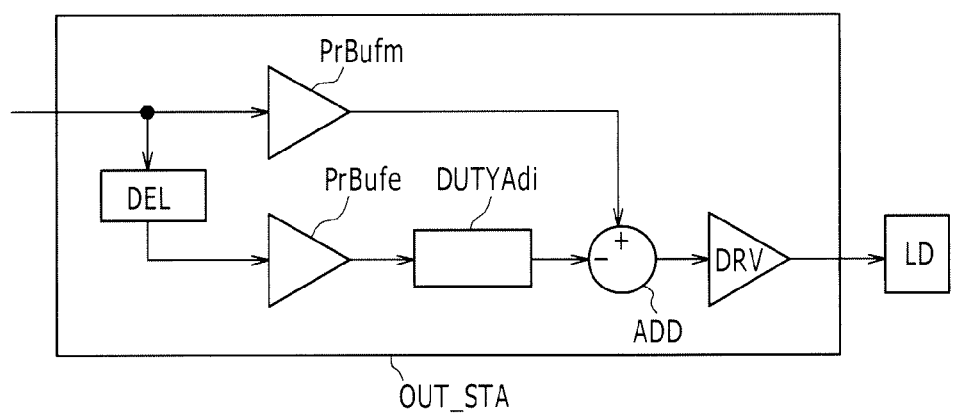
Figure 10B:
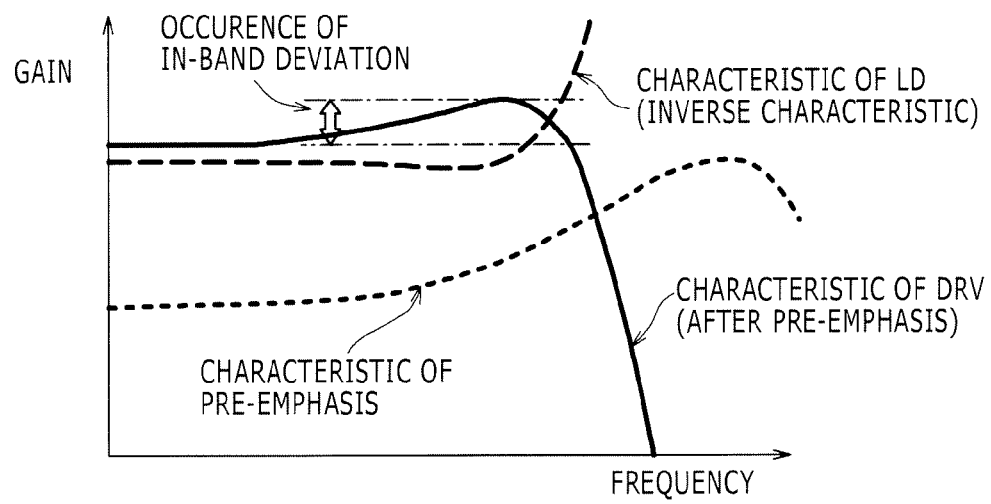

The preamplifier PRAMP on the reception side includes two typical circuit systems: a negative feedback preamplifier PRAMP which connects a negative feedback resistor Rf between the input and output of a voltage amplifier VAMP, as shown in FIG. 9A, and a regulated cascode (RGC) preamplifier PRAMP which converts and amplifies an input current to a voltage by a load resistor RL1, as shown in FIG. 9B. Both the circuit systems can achieve high-speed communication by input impedance lowering. For instance, in order that the communication speed is 25 Gbps, their input impedance is approximately several tens of Ω.

Consequently, on the reception side, reflection is caused between the semiconductor chip LDD/TIA and the package. To prevent the reflection, it is necessary to put a termination resistor RTrm of approximately 20Ω in the input terminal of the preamplifier PRAMP in the chip. However, the termination resistor RTrm increases the input referred noise of the preamplifier PRAMP. This results in deterioration of the light reception sensitivity of the transimpedance amplifier TIA.

Figure 6B:
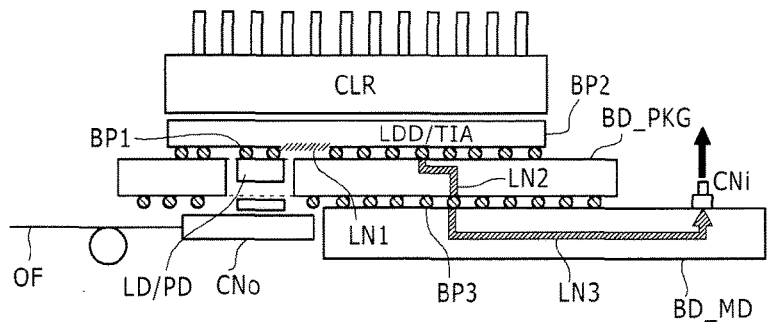

FIG. 6B shows a cross-sectional view of the mounting structure example of the transmission/reception optical communication module, which solves the problems caused by the conventional mounting structure of the transmission/reception optical communication module.

In the embodiment of the present invention, the optical device LD/PD is flip chip bonded over the semiconductor chip LDD/TIA. The optical device LD/PD is connected to the semiconductor chip LDD/TIA via the bump BP1 formed on a first plane thereof and via the wiring LN1 and the bump BP2 formed on a first plane of the semiconductor chip LDD/TIA. The optical device LD/PD is thus electrically connected to the semiconductor chip LDD/TIA. Like the conventional mounting structure, the semiconductor chip LDD/TIA is electrically connected to the connector CNi via the package wiring substrate BD_PKG, the bump on the module wiring substrate BD_MD, and the wirings LN2 and LN3.

An optical signal is inputted from the optical device LD/PD in the direction of the module wiring substrate BD_MD. The optical signal is then inputted to and outputted from the optical communication line OF via the optical connector CNo including a collimate lens and a converging lens.

Figure 6C:
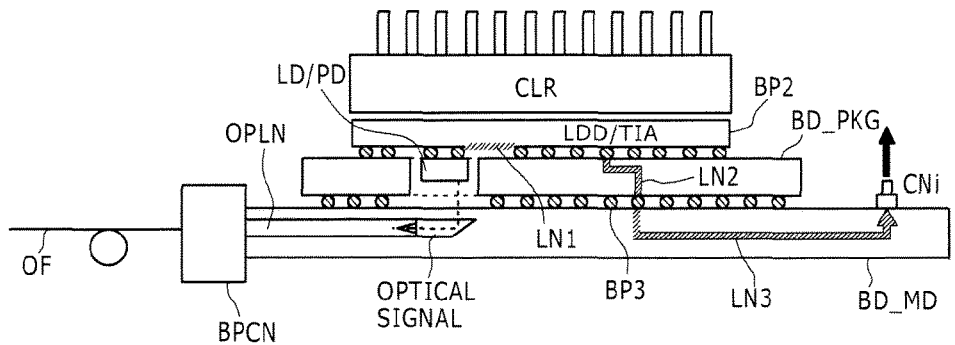

Alternatively, in the mounting structure of the present invention, since the optical signal is inputted and outputted in the direction of the module wiring substrate BD_MD, as shown in FIG. 6C, it may be inputted to and outputted from the optical communication line OF via an optical waveguide OPLN and a back plane connector BPCN. In this embodiment, since the material of the semiconductor chip LDD/TIA has a larger film pressure than the package wiring substrate BD_PKG, the wiring LN1 can be formed to have a low impedance of 10Ω or less, thereby electrically connect the optical device LD/PD to the semiconductor chip LDD/TIA.

On the transmission side, the influence of reflection caused due to impedance mismatching with the low-impedance element such as the DFB-LD can be reduced. On the reception side, the termination resistor RTrm on the input terminal of the semiconductor chip LDD/TIA for preventing the reflection is unnecessary. The light reception sensitivity of the transimpedance amplifier TIA can thus be improved.

In addition, in this embodiment, the entire second plane of the semiconductor chip LDD/TIA is cooled by the cooling unit CLR. Heat generated by the laser diode LD is released to the cooling unit CLR via the semiconductor chip LDD/TIA. The heat releasing structure for the laser diode LD is more efficient than the conventional mounting structure.

Sixth Embodiment

Figure 12:
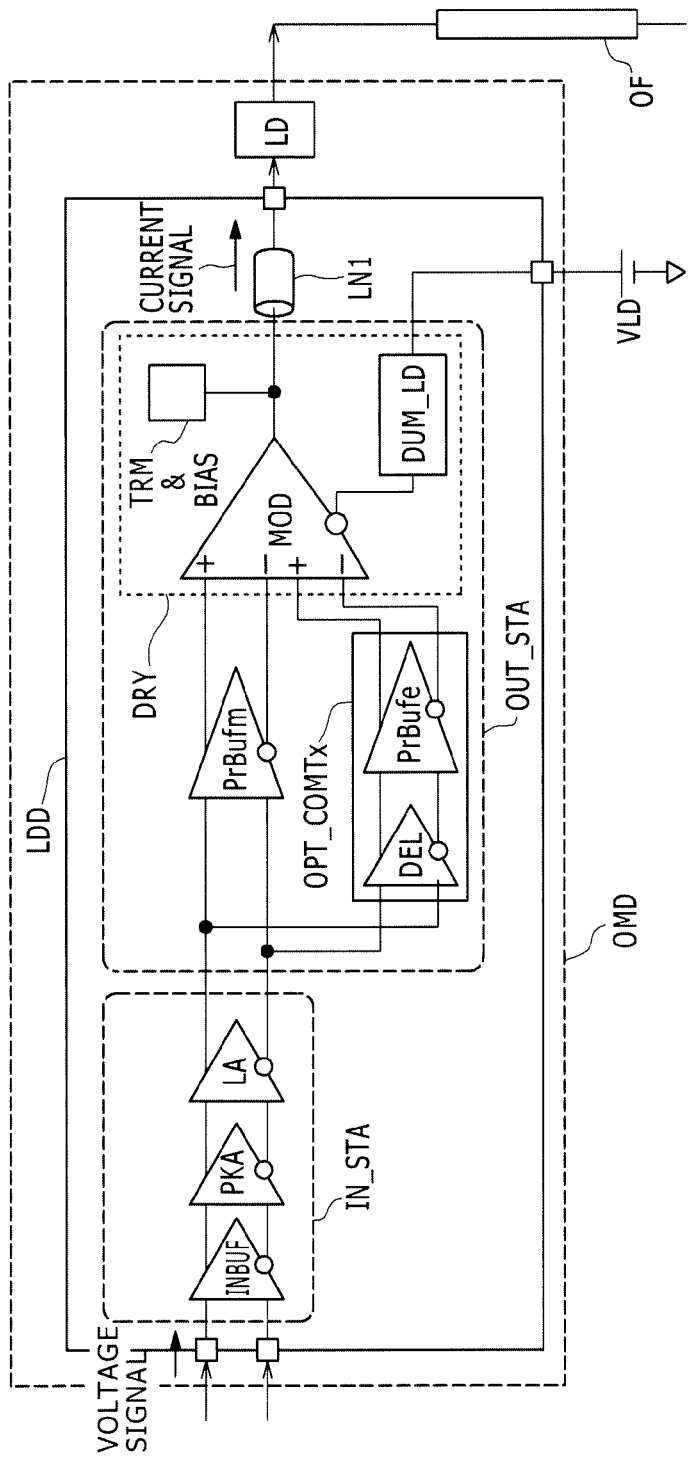
FIG. 12 is a diagram showing a configuration example of a laser diode driver LDD of the transmission system of the optical communication module according to a fifth embodiment of the present invention.

FIG. 12 shows a configuration example of the laser diode driver LDD of the transmission system of the optical communication module of the fifth embodiment of the present invention.

In the laser diode driver LDD according to this embodiment, an input stage IN_STA receives a voltage signal outputted from the transmission speed conversion circuit SDC mounted in the logic device LSI_LG. An output stage OUT_STA converts the voltage signal to a current signal, and then supplies the current signal to the laser diode LD via the wiring LN1 formed in the chip.

The input stage IN_STA includes an input circuit INBUF which can change a DC gain according to the length of the electric transmission line between the logic device LSI_LG and the laser diode driver LDD, a peaking amplifier PKA including a waveform equalization function for compensating for ISI caused by loss in the electric transmission line, and a limit amplifier LA which inputs a constant voltage amplitude to the output stage OUT_STA without depending on the magnitude of the voltage amplitude of an input signal.

The output stage OUT_STA branches the output signal from the limit amplifier LA into a main signal and a compensation signal with respect to a prebuffer PrBufm and an optical characteristic compensation circuit for transmission OPT_COMTx. The output circuit DRV converts the voltage signal from the prebuffer PrBufm and the optical characteristic compensation circuit for transmission OPT_COMTx to a current signal.

Here, the laser diode LD has a single end input. When the output circuit DRV generates a modulation current for driving the laser diode LD, the power supply thereof varies. Then, the power supply variation leaks into the laser diode LD, resulting in optical output waveform deterioration. To prevent the influence of the power supply variation, in the embodiment shown in FIG. 12, a dummy circuit DUM_LD of the laser diode LD is provided in the chip to differentially operate the output circuit DRV.

In this embodiment, the dummy circuit DUM_LD is provided in the chip, but a dummy laser diode may be provided outside the chip.

The OPT_COMTx includes the delay circuit DEL and a prebuffer PrBufe. The OPT_COMTx achieves pre-emphasis in which a constant delay difference with respect to the main signal is provided to the compensation signal so that the output circuit DRV enhances only a signal transition timing. In addition, in the configuration example of FIG. 12, a termination circuit TRM is provided to perform manufacturing variation compensation of the wiring LN1 and impedance matching between the wiring LN1 and the output circuit DRV.

Figure 7A:
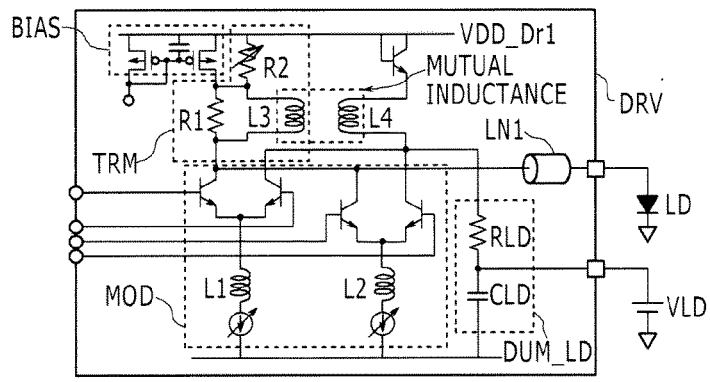
Figure 7B:
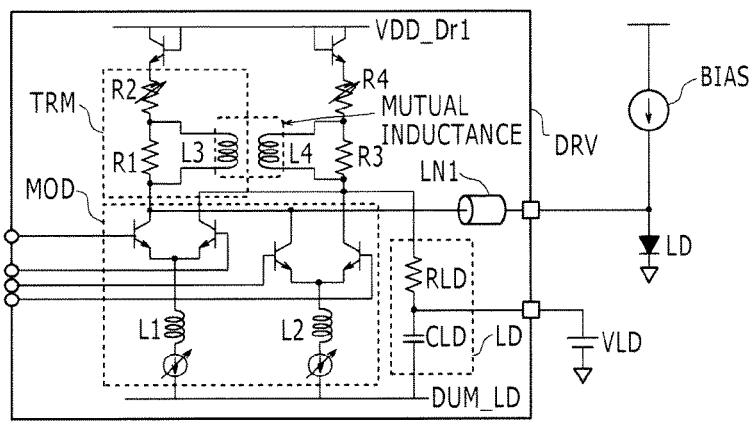
Figure 7C:
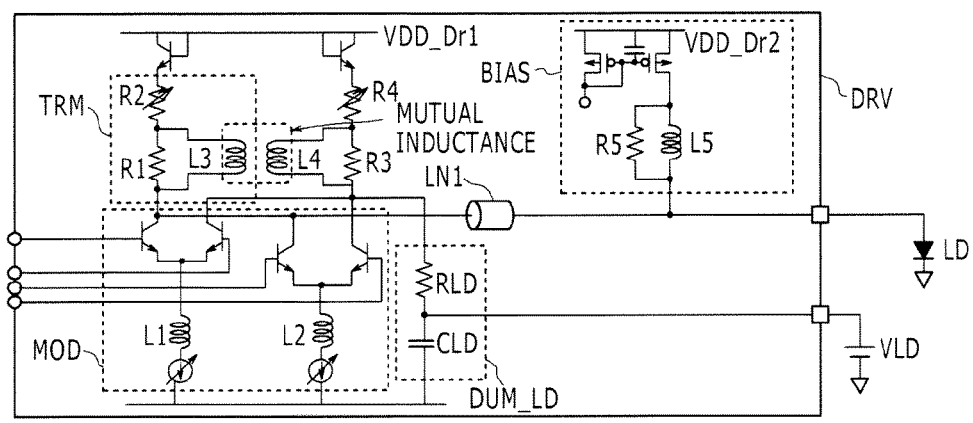

FIGS. 7A, 7B, and 7C are circuit diagrams showing the specific configuration examples of the output circuit DRV of the laser diode driver LDD shown in FIG. 12. The output circuit DRV includes a bias current supplying circuit BIAS which supplies a DC bias current to the laser diode LD, a differential amplifier MOD which supplies high-speed modulation electricity to the laser diode LD, the termination circuit TRM for taking impedance matching with the wiring LN1, and the dummy circuit DUM_LD of the laser diode LD which prevents power supply variation of a power source VDD_Dr1 with the high-speed operation of the differential amplifier MOD.

To operate the output circuit DRV at high speed, it is necessary to minimize the parasitic capacitance of the output terminal thereof. The PMOS transistor of the bias current supplying circuit BIAS which supplies a large bias current to the laser diode LD increases in size. Thus, in particular, it is necessary to prevent the influence of the parasitic capacitance caused here.

In addition, reduction of the parasitic capacitance of the output terminal can hold impedance matching between the output circuit DRV and the wiring LN1 to a high-frequency component. The influence of reflection can thus be reduced to improve transmission quality.

In the configuration example shown in FIG. 7A, the termination circuit TRM is directly connected between the bias current supplying circuit BIAS and the output terminal of the differential amplifier MOD. Further, the termination circuit TRM includes a resistor R2 which reduces the impedance of the low-frequency component of the output circuit DRV, an inductor L3 which improves the impedance of a high-frequency component, and a resistor R3 which reduces the Q value of the inductor L3 and defines the impedance of a high-frequency component. The influence of the parasitic capacitance can thus be reduced, thereby enabling impedance control to a high-frequency component.

In addition, the inductor L3 has a mutual inductor relation with a load inductor L4 which drives a TRM_DM. With the differential operation of the differential amplifier MOD, the inductor value of the inductor L3 can be enhanced to achieve higher-speed operation.

Further, for parasitic capacitance reduction, FIG. 7B shows a configuration example in which the bias current supplying circuit BIAS is provided outside the chip, and FIG. 7C shows a configuration example in which the bias current supplying circuit BIAS is provided at the distal end of the wiring LN1 (the laser diode LD side). In these configuration examples, the termination circuit TRM and the bias current supplying circuit BIAS are separated from each other. Therefore, in addition to the parasitic capacitance reduction effect, supply of the bias current to the laser diode LD can be controlled independently without considering the electric current flowing from the termination resistor of the termination circuit TRM.

In addition, in the configuration example of FIG. 7C, an inductor L5 and a resistor R5 are provided in parallel in the drain terminal of the PMOS transistor. The influence of the parasitic capacitance of the PMOS transistor can thus be reduced, thereby operating the output circuit DRV at high speed.

In this embodiment, inductors L1 and L2 are connected between the current source and the emitter terminal of the bipolar transistor. Thus, the influence of the parasitic capacitance of the transistor configuring the current source can be prevented. The waveform quality of the modulation current of the differential amplifier MOD can thus be improved.

Seventh Embodiment

Figure 8A:
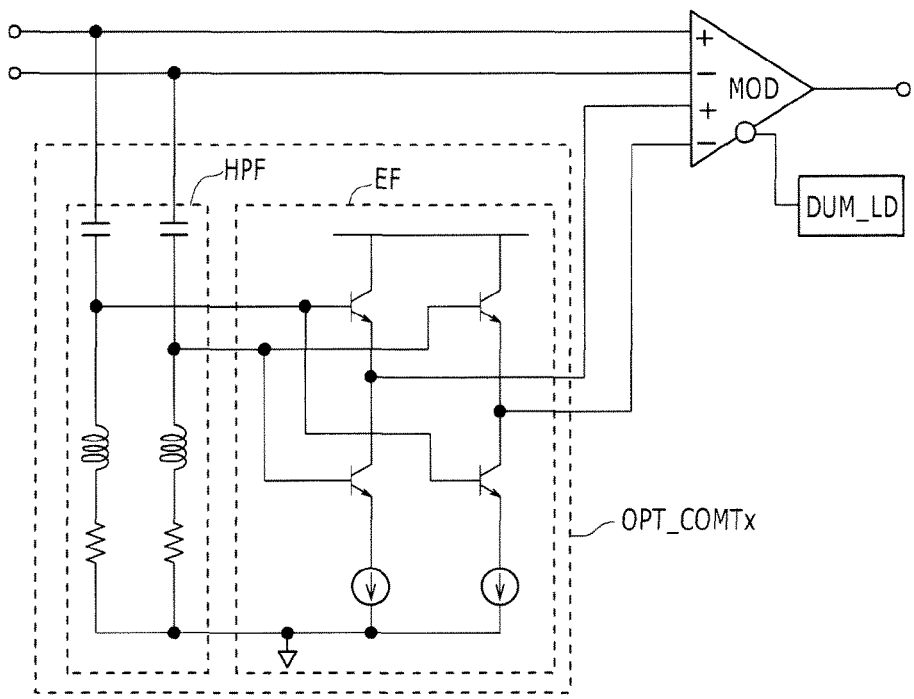
Figure 8B:
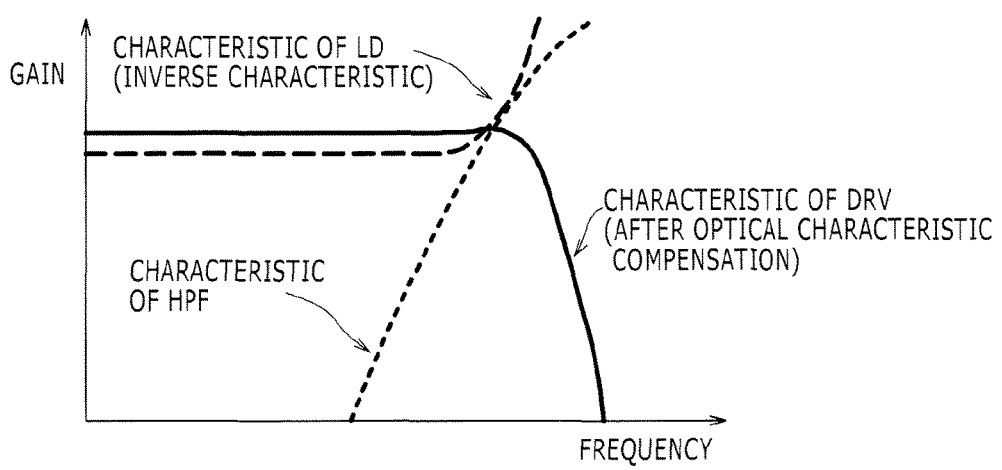

FIG. 8A shows a configuration example of another embodiment of the optical characteristic compensation circuit OPT_COMTx of the laser diode driver LDD of the optical communication module according to the sixth embodiment. FIG. 8B is an explanatory view showing an effect with the frequency characteristic.

In pre-emphasis in which due to the relaxation oscillation frequency characteristic of the laser diode LD, a compensation signal having a constant delay difference with respect to a main signal is generated, and is subtracted from the main signal, thereby performing high-frequency signal enhancement, an in-band deviation occurs in the intermediate frequency bandwidth. This results in jitter increase to deteriorate signal quality.

Further, in pre-emphasis, when like the present invention, the laser diode LD with bandwidth shortage is used, the signal enhancing amount necessary for transmission is large. It is thus necessary to flow a large electric current, not only to the compensation signal, but also to the main signal from which the compensation signal is subtracted. This results in increase in the power consumption of the laser diode driver LDD.

Therefore, in this embodiment, instead of pre-emphasis, a differential waveform is generated from a main signal, and is then added to the main signal, thereby enhancing only a high-frequency component. Specifically, the optical characteristic compensation circuit OPT_COMTx includes a high-pass filter HPF which generates the differential waveform, and an emitter follower EF which adds an electric current to the main signal at high speed.

In this embodiment, the high-pass filter HPF is of a primary order, but may be of a high order when higher-speed waveform enhancement is necessary according to the frequency characteristic of the laser diode LID.

In the configuration example of FIG. 8B, the optical characteristic compensation circuit OPT_COMTx uses the emitter follower EF for the bipolar transistor. However, the optical characteristic compensation circuit OPT_COMTx may use a CMOS circuit which includes a source follower or any circuit configuration as long as it can drive the differential waveform.

This configuration adds only the differential waveform to the main signal, although pre-emphasis subtracts the compensation signal from the main signal. Waveform equalization with low power consumption is thus enabled. Further, as shown in the frequency characteristic shown in FIG. 8B, when only the high-frequency component is added, no in-band deviation occurs in the intermediate frequency bandwidth. Thus, a jitter increase with waveform equalization can be prevented to enable high-quality transmission waveform generation.

The optical communication module and the router according to these embodiments are useful to be applied to, in particular, an optical communication module and a router which perform communication via an optical fiber cable. The present invention is not limited to this, and is widely applicable to all products which perform optical communication using a laser diode.

What is claimed is:
1. A transimpedance amplifier comprising:
a preamplifier which receives, as an input, a single-phase current signal of an output of a photodiode and converts the single-phase current signal to a single-phase voltage signal;

a −3 dB frequency of a laser diode which generates an optical signal inputted to the photodiode being lower than a basic frequency which is a half frequency of a communication speed;

a threshold control circuit which detects a center potential of the single-phase voltage signal of the output of the preamplifier and generates upper and lower threshold voltages whose electric potentials are shifted to plus and minus sides with respect to the center potential;

a first latch circuit which uses the upper threshold voltage of the output of the threshold control circuit as a threshold value and converts the single-phase voltage signal of the output of the preamplifier from an analog value to a digital value;

a second latch circuit which uses the lower threshold voltage of the output of the threshold control circuit as a threshold value and converts the single-phase voltage signal of the output of the preamplifier from an analog value to a digital value; and a selector circuit which selects one of an output path in which sign determination is performed by the upper threshold voltage of the first latch circuit when one previous bit associated with a bit for symbol decision is at a high level (one), and an output path in which sign determination is performed by the lower threshold voltage of the second latch circuit when one previous bit associated with a bit for symbol decision is at a low level (zero).

2. The transimpedance amplifier according to claim 1, further comprising a determination feedback equalizer which has a flip flop circuit with respect to the output of the selector circuit, the flip flop circuit inputting the output signal thereof, as the selection signal of the selector circuit, to the selector circuit, and selects one of the output path in which the upper threshold voltage is used as a threshold voltage to convert an analog value to a digital value when said one previous bit is determined to be at the high level based on the logic determination result of the flip flop circuit, and the output path in which the lower threshold voltage is used as a threshold voltage to convert an analog value to a digital value when said one previous bit is determined to be at the low level based on the value of one previous bit stored by the flip flop circuit,
wherein an NRZ signal inputted to the photodiode is signal-processed as a duobinary signal.

3. The transimpedance amplifier according to claim 2, further comprising:
a third latch circuit which uses the center potential of the output of the threshold control circuit as a threshold value and converts the single-phase voltage signal of the output of the preamplifier from an analog value to a digital value at a data transition timing;
a clock data recovery circuit which generates a phase control signal for adjusting the phases of clocks supplied to the first, second, and third latch circuits from the output of the flip flop circuit and the output of the third latch circuit;
a phase-locked loop which generates clock signals supplied to the first, second, and third latch circuits and the clock data recovery circuit; and
a phase rotation circuit which adjusts the phases of the clock signals based on the phase control signal,
wherein the timings of the clock signals supplied to the first, second, and third latch circuits are controlled independently.

4. The transimpedance amplifier according to claim 3,
wherein the threshold control circuit includes a threshold detection circuit which is a low-pass filter and detects the center potential from the single-phase voltage output of the preamplifier, the output thereof being connected to three level shift circuits which generate the threshold voltages of the first, second, and third latch circuits from the center potential and independently level-shift the voltages for generating the upper and lower threshold voltages from the center potential.

5. The transimpedance amplifier according to claim 4,
wherein the level shift circuits each include an operational amplifier whose negative input is connected to the input terminal thereof, and can set potential differences for generating the upper and lower threshold voltages between the positive input and the output terminal of the operational amplifier, and
wherein the set values of the potential differences are held by a storage unit.

6. The transimpedance amplifier according to claim 4, further comprising an optical characteristic compensation circuit which automatically adjusts, according to change in the characteristic of an optical waveform inputted to the photodiode due to temperature change of the laser diode, the phases of the phase rotation circuit which determine the phases of the clock signals supplied to the first, second, and third latch circuits and the level shift amounts of the level shift circuits which generate the upper and lower threshold voltages, by detecting error phases and error voltages between optimum phases and upper and lower threshold voltages and the phases and the upper and lower threshold voltages, so that the error phases and the error voltages are minimum.

7. The transimpedance amplifier according to claim 6,
wherein the optical characteristic compensation circuit includes two peak voltage detection circuits which detect the high and low levels of the single-phase voltage signal of the preamplifier, two adders which generate average voltage levels between the detected high-level and low-level voltages and the center potential, two selector circuits which select and output ones of the outputs of the adders and reference voltages indicating assumed optimum upper and lower threshold voltages supplied from outside, two error detection circuits which detect error voltages between the outputs of the selector circuits and the upper and lower threshold voltages of the outputs of the threshold control circuit, and a compensation logic circuit which supplies, to the threshold control circuit, level shift amount adjusting signals of the upper and lower threshold voltages so that the error voltages are minimum from the outputs of the error detection circuits.

8. The transimpedance amplifier according to claim 6,
wherein the optical characteristic compensation circuit monitors the phase of the clock signal supplied from the clock data recovery circuit to the third latch circuit, detects errors between the assumed optimum phases of the clock signals supplied to the second and third latch circuits and the currently set phases of the second and third latch circuits, and supplies a phase adjusting signal to the phase rotation circuit so that the phase errors are minimum.

9. The transimpedance amplifier according to claim 6,
wherein the optical characteristic compensation circuit has the error detection circuits which detect an error with respect to a data pattern from the output of the flip flop circuit or the output of the clock data recovery circuit, and supplies the level shift amount adjusting signals to the threshold control circuit and supplies the phase adjusting signal to the phase rotation circuit so that the errors of the error detection circuits are minimum with respect to an optional data pattern.

10. The transimpedance amplifier according to claim 1, wherein the threshold control circuit providing offset voltage compensation adds voltages of the inverse characteristics of the offset voltages due to semiconductor process variations of the latch circuits to the upper and lower threshold voltages, and outputs the resultant voltages.

* * * * *